United States Patent [19]

Aneha et al.

[11] Patent Number: 4,701,778
[45] Date of Patent: Oct. 20, 1987

[54] SEMICONDUCTOR INTEGRATED CIRCUIT HAVING OVERLAPPING CIRCUIT CELLS AND METHOD FOR DESIGNING CIRCUIT PATTERN THEREFOR

[75] Inventors: Nobuhiko Aneha, Kawasaki; Shigenori Baba, Yokohama, both of Japan

[73] Assignee: Fujitsu Limited, Kawasaki, Japan

[21] Appl. No.: 748,599

[22] Filed: Jun. 25, 1985

[30] Foreign Application Priority Data

Jun. 29, 1984 [JP] Japan ................. 59-135410

[51] Int. Cl.$^4$ ............. H01L 27/10; H01L 23/50
[52] U.S. Cl. ............................. 357/45; 357/42; 357/46; 357/65; 357/68; 357/71; 307/303; 307/304
[58] Field of Search ............ 357/68, 71, 45, 65, 357/46, 42; 307/303, 304

[56] References Cited

U.S. PATENT DOCUMENTS

| | | | |
|---|---|---|---|
| 3,943,551 | 3/1976 | Skorrup | 357/46 |
| 4,125,854 | 11/1978 | McKenny et al. | 357/45 |
| 4,161,662 | 7/1979 | Malcolm et al. | 357/45 |
| 4,240,097 | 12/1980 | Raymond, Jr. | 357/68 |
| 4,566,022 | 1/1986 | Kalter et al. | 357/45 |

FOREIGN PATENT DOCUMENTS 2018021 10/1979 United Kingdom ............ 357/45

OTHER PUBLICATIONS

*Computer Design*, vol. 23, No. 3, 3/84, pp. 159-169, Winchester Mass. U.S., J. Bond "Semicustom Circuits Arrive".

Primary Examiner—Andrew J. James
Assistant Examiner—Jerome Jackson
Attorney, Agent, or Firm—Staas & Halsey

[57] ABSTRACT

The packing density of a logic LSI based on standard cell methodology is increased by partially overlapping two adjoining cells so as to have common terminal regions to be connected to the wirings for supplying power. To this end, the pattern of the terminal region at a side edge of the cells in the row direction is standardized in its shape, size and position in each cell. The cells are registered in the cell library of a CAD system, together with a newly introduced additional symbol to indicate the region which may be overlapped during chip design operation using a display.

3 Claims, 19 Drawing Figures

SEMICONDUCTOR INTEGRATED CIRCUIT HAVING OVERLAPPING CIRCUIT CELLS AND METHOD FOR DESIGNING CIRCUIT PATTERN THEREFOR

BACKGROUND OF THE INVENTION

This invention relates to a semiconductor integrated circuit, and more specifically to an improvement in the circuit pattern design of logic LSIs base on so-called standard cell methodology.

Recent fine patterning technology for semiconductor circuits makes it possible to provide logic LSIs having numbers of gates ranging from a few to tens of thousands of gates per chip. On the other hand, there are increasing demands for a variety of logic LSIs tailored to meet user's specific requirements.

The provision of a fully-customized LSI necessarily starts with the design and positioning of transistors on a chip, and design optimization is directed to maximizing the efficiency in chip area utilization and performance of the circuit. However, such full custom design has disadvantages in that a long turnaround time (one-half year or more) is generally required, and there is little flexibility in the modification of the chip design because it has been highly optimized. As a result, several methodologies, such as gate array and standard cell methods, have been proposed for developing customized LSIs in a short turnaround time and with design flexibility.

In the gate array method, a customized logic LSI is fabricated by only providing wirings for a desired circuit network on a silicon wafer in stock, on which transistors are formed in advance. The number of masks necessary for the customization is about ⅓ of the total number of masks used in the fabrication of the LSI.

The standard cell method uses pre-defined patterns of unit circuits (cells) corresponding to logic gates (e.g., NAND, NOR, inverter, flip-flop, etc.). These patterns of the cells are registered as a library in a computer system. The design of an LSI chip is carried out on the basis of the placement and interconnection routing of the cells with the support of a CAD (computer aided design) system, and all the masks are customized for each kind of LSI.

The standard cell method has the following features: (a) the information on the patterns and electrical characteristics of circuit elements such as transistors is well-organized in the library of the CAD system, so that efficient control of LSI chip design can be attained; (b) as a result of (a), errors which usually occur in the chip design can be decreased; (c) more efficient use of chip area can be achieved than in the gate array method. Thus, the standard cell method has a relatively large amount of freedom in the chip design, provides a possibility of LSI design without expert knowledge of the circuit elements, and decreases the risks involved in the development of the LSI.

FIG. 1 is a conceptual schematic diagram of an example of the placement and interconnection-routing of cells in accordance with the standard cell method. Referring to FIG. 1, various kinds of cells 1 are arranged in rows on a semiconductor substrate 2. They are formed in a substantially rectangular frame of the same height but generally vary in width in accordance with the kind of cell. These cells are interconnected by wirings 3 formed to be distributed in the regions (sometimes referred to as wiring channels) between adjacent sets of two cell rows. Each of the cells 1 has a predefined pattern for providing circuit elements such as transistors and inner wiring layers therein. FIG. 2A is a plan view of an exemplary pattern providing a 2-input NAND gate of CMOS (complementary metal oxide semiconductor) type logic in a frame, and having the equivalent circuit shown in the circuit diagram of FIG. 2B.

Referring to FIG. 2A, the 2-input NAND cell occupies an area defined by a substantially rectangular virtual frame indicated by broken line 100. The dimension of the frame size is in the range of about a few tens of microns to one hundred microns. Circuit components, such as MOS transistors P1, P2, N1 and N2, are formed in the frame, while nodes for the external connections are formed to extend across the frame 100. The hatched areas illustrate wiring layers of aluminum (A1), for example. I1 and I2 indicate the nodes for receiving input signals and OT represents an output node. $B_{VDD}$ and $B_{VSS}$ are the bus lines to be connected to positive and negative side voltage sources $V_{DD}$ and $V_{SS}$, respectively.

For a better understanding of FIG. 2A, the configuration of the pattern shown in FIG. 2A is further explained with reference to FIGS. 2C and 2D. FIG. 2C is a plan view of a bulk pattern providing the MOS transistors P1, P2, N1 and N2, and FIG. 2D is a plan view of the pattern of inner wiring layers interconnecting the transistors, including the layers for the bus lines $B_{VDD}$ and $B_{VSS}$. Referring to FIG. 2C, a p-type region 101 (enclosed by solid line 101') and an n-type region 102 (enclosed by solid line 102') are formed in the frame 100 by selectively implanting p-type and n-type impurities therein. The area outside the regions 101 and 102 are coated with a thick insulating layer (not shown), for example, an oxide layer (generally referred to as a "field oxide layer"). A pair of gate electrodes 103 and 104, both composed of polysilicon, for example, are formed across the p-type and n-type regions 101 and 102 with the intervention of respective thin insulating layers (not shown), such as oxide layers (generally referred to as "gate oxide layers"), formed on the regions 101 and 102. Thus, p-channel MOS transistors P1 and P2 are formed in the n-type region 101 and n-channel MOS transistors N1 and N2 are formed in the p-type region. The p-type region 101 and n-type region 102 are respectively provided with extra regions 109 and 110 which are referred to as bus line contact regions hereinafter, and respective contacts to the bus lines $B_{VDD}$ and $B_{VSS}$ are formed therein as described below.

A set of wiring patterns 105, 106 and 107, as shown in FIG. 2D, are fabricated on the bulk pattern of FIG. 2C, and are composed of aluminum, for example. The wiring patterns have contacts to the bulk pattern through windows 108 formed in the insulating layer (not shown) at the positions indicated in FIGS. 2A and 2D. Thus, the p-channel transistors P1 and P2 and n-channel transistors N1 and N2 are interconnected to form a 2-input NAND gate as shown in FIG. 2B. On the extended portions 105' and 107' in the vertical direction of the bus lines $B_{VDD}$ and $B_{VSS}$ are provided contact points to the corresponding underlying portions of the p-type and n-type regions (aforesaid bus line contact regions 109 and 110) to supply the portions with positive and ground potential, respectively. The regions occupied by such extended portions 105' and 107' of the bus lines and their coresponding underlying p-type and n-type portions are referred to as bus line contact regions. The configurations of other logic cells including a NAND gate having 3 or 4 inputs, a NOR gate, an inverter, etc. are essentially the same as explained with reference to FIGS. 2C and 2D.

For generating a final bulk pattern of a logic circuit cell as shown in FIG. 2A, individual mask patterns for each of the processes (for example, those for creating p-type and n-type regions, gate electrodes, wiring lines, etc.) are designed. A complete set of information relevant to the mask patterns for each kind of cell, is registered in a library of a CAD system. In LSI chip design, therefore, when a designer has access to the library by using the name of a desired cell, the frame of the cell is displayed on a display device. The designer is only required to determine the location of the cell frame and the routing of interconnections among the cells. The pattern information for all of the cells disposed on a chip is edited and stored in a mask pattern data file. Then, a comprehensive mask pattern for each production process relevant to all of the cells, is generated by a computer system.

FIG. 3A is a plan view of a partial bulk pattern of a CMOS-LSI, showing a 3-input NAND gate (Cell 1) and 4-input NAND gate (Cell 2) abutting each other, together with internal wiring layers (hatched patterns) formed thereon, positioned according to conventional standard cell placement rules. FIGS. 3B and 3C are circuit diagrams of the equivalent circuits of the 3-input NAND gate and the 4-input NAND gate, respectively, in FIG. 3A. Referring to FIG. 3A, Cells 1 and 2 are defined in the respective virtual frames denoted by reference numbers 200 and 300. Cell 1 includes a p-type region 201, an n-type region 202 and three gate electrodes 203, all for providing p-channel transistors P1, P2 and P3 and n-channel transistors N1, N2 and N3. Cell 2 includes a p-type region 301, and n-type region 302 and four gate electrodes 303, all for providing p-channel transistors P1, P2, P3 and P4 and n-channel transistors N1, N2, N3 and N4. The transistors in Cells 1 and 2 are interconnected by respective first and second sets of internal wiring layers, wherein wiring layers 205, 206, 207 form the first set, and wiring layers 305, 306, 307 form the second set. Thus, a 3-input NAND gate and a 4-input NAND gate are provided in the frames 200 and 300, respectively. The wiring layers 205 and 305 are connected to each other with their nodes extending out across the frames 200 and 300, respectively, and the wiring layers 207 and 307 are connected to each other with their nodes extending out across the frames 200 and 300, respectively, so that the respective bus lines $B_{VDD}$ and $B_{VSS}$ can run throughout the cells in the row.

The pattern information for all the cells placed on the same chip is processed in a CAD system, and an individual mask pattern for each fabrication process is generated in common for all of the cells. Such mask patterns include those for: (a) defining regions to be later characterized as the p-type and n-type regions; (b) providing mask layers for the regions to which p-type and n-type impurities are to be selectively diffused; and (c) delineating the gate electrodes and the wiring layers.

As described above, in the conventional standard cell method, the adjoining cells are disposed to have frames which are abutting but not overlapping each other, and effective use of chip area is limited by the adjustment in cell placement which is necessary to minimize the region allocated for the aforesaid wiring channels. Even if the wiring channel area is minimized, the efficiency in the use of chip area in the conventional standard cell method is, in general, far from the efficiency for the fully customized chip. Therefore, the improvement of chip area utilization has been a matter of serious concern with the conventional standard cell methodology.

SUMMARY OF THE INVENTION

It is an object of the present invention to provide an LSI having improved chip area utilization.

It is another object of the present invention to provide a method for improving chip area utilization of an LSI having a standard cell configuration.

Referring back to FIG. 3A, the present invention takes advantage of the fact that the bus line contact regions 209 and 309 (corresponding to the bus line $B_{VDD}$ and the respective corresponding underlying portions of the p-type regions 201 and 301) are not required to be independent of each other to perform their functions. The same is true for the bus line contact regions 210 and 310 which correspoond to the bus line $B_{VSS}$ and the respective corresponding underlying portions of the n-type regions 202 and 302. The inventors have recognized this point, and have devised a method of making two cells (such as Cells 1 and 2) abutting each other in a row to instead partially overlap each other, so that they can have respective single bus line contact regions in common for each of the bus lines $B_{VDD}$ and $B_{VSS}$.

In the present invention, the pattern of the bus line contact regions is designed to be standard for all kinds of cells, and additional information for indicating the region occupied by the standard bus line contact regions is added to the pattern information of each cell. During the stage of LSI chip design, the cells are arranged taking into account the additional information indicating the regions which might possibly overlap each other. Thus, in a logic LSI based on the standard cell methodology according to the present invention, every couple of desired circuit cells arranged to adjoin each other in a row have a pair of bus line contact regions for the bus lines $B_{VDD}$ and $B_{VSS}$ in common with each other if they can be arranged to overlap each other. As a result, the total chip area occupied by the cells decreases in proportion to the number of such overlappings.

As shown by the bulk patterns of FIGS. 2A and 3A, in general each of the circuit cells has only one pair of bus line contact regions to be standardized adjacent to one vertical side of the cell. Accordingly, two adjoining cells of the same kind cannot have a common pair of bus contact regions. In this case, an inverted pattern of the cell is recalled and positioned to partially overlap with the corresponding noninverted pattern. The definition and details of the inversion are set forth below together with a discussion of the disdavntages of providing a pair of bus line contact region for each side of a cell in order to permit two adjoining cells to overlap each other without using the inversion procedure.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 4:
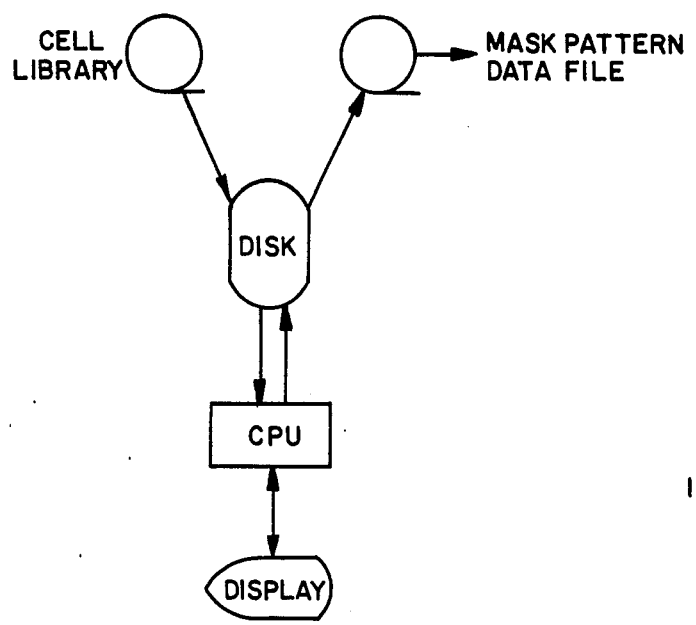
FIG. 4 is a block diagram of a conceptual configuration of a CAD system used for the standard cell method in accordance with the present invention.
Figure 5A:
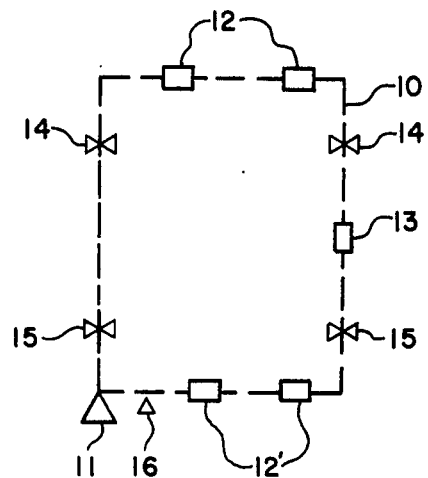
FIG. 5A is a diagram of a cell frame displayed on the screen of a display terminal in a CAD system in accordance with the present invention.

FIG. 4 is a block diagram of a conceptual configuration of a CAD system used for the standard cell method according to the present invention. The pattern information for various standard cells (i.e., logic circuit blocks such as NAND, NOR, etc.) is stored in the cell library (CELL LIBRARY). When an operator requests the central processing unit (CPU) to access the cell library by inputting the name of a desired cell, the pattern information for the cell is loaded in a random access memory such as disk storage (DISK), and the cell frame and other optional symbols (as shown in FIG. 5A) are displayed on the screen of a display terminal (DISPLAY). In the same manner, cells of the same or different kinds are called on the screen by their names. The position of each cell on the screen can be arbitrarily selected by the operator.

Referring to FIG. 5A, a large triangle 11 is provided to indicate the position of a cell frame 10 on a coordinate plane defined in the CAD. Therefore, the symbol 11 is referred to as "origin information". The small rectangles 12 and 12' indicate the positions of input nodes, such as I1, I2, etc. (see FIG. 2A and FIG. 3A), while the rectangle 13 indicates the position of an output node (e.g., OT). Symbols 14 and 15 which are shaped like butterflies or bowties, indicate the nodes for the bus lines $B_{VDD}$ and $B_{VSS}$ in FIGS. 2A and 3A, respectively. A small triangle 16 is a symbol which is newly added to the pattern information for logic circuit cells in accordance with the present invention.

Figure 5B:
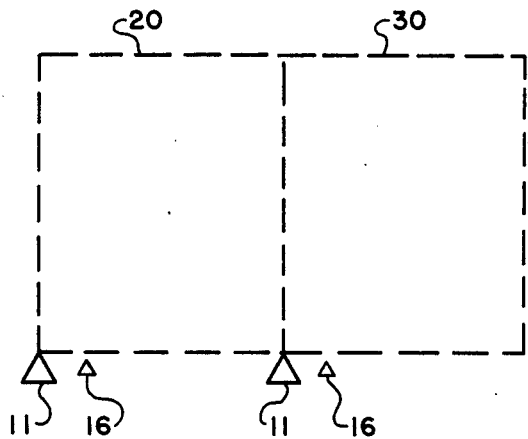
FIG. 5B is a simplified diagram of two cell frames for two cells abutting each other.
Figure 5C:
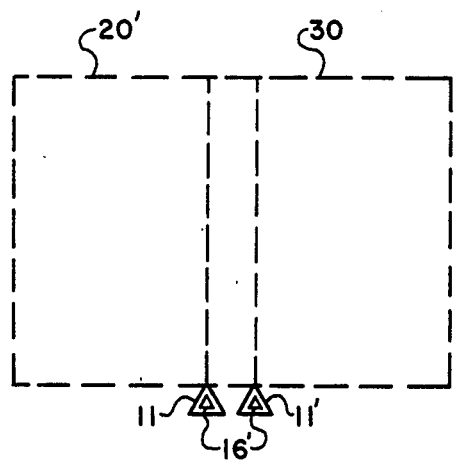
FIG. 5C is a simplified diagram of two cell frames for two cells sharing an overlapped region.

The symbol 16, which is referred to as auxiliary origin information, indicates the regions permitted to overlap with an adjacent cell. That is, when the frames 20 and 30 of two cells are disposed to abut each other as shown in FIG. 5B, and there is no restriction against the cells overlapping each other, another frame having a mirror image relation to the frame 20 (with respect to the vertical axis) is fetched to replace the frame 20 (this frame is referred to as an inverted frame, hereinafter.) Then, the positions of the frame 30 and inverted frame 20' are adjusted to partially overlap each other as shown in FIG. 5C. In FIG. 5C, the origin information 11' and auxiliary origin information 16' correspond to the frame 20', while symbols 11 and 16 correspond to the frame 30. If the operator foresees the overlapping of desired cells prior to the fetching of their corresponding cell frame and information, the operator can obtain an inverted frame (such as frame 20') in place of the step explained with reference to FIG. 5B.

Figure 2A:
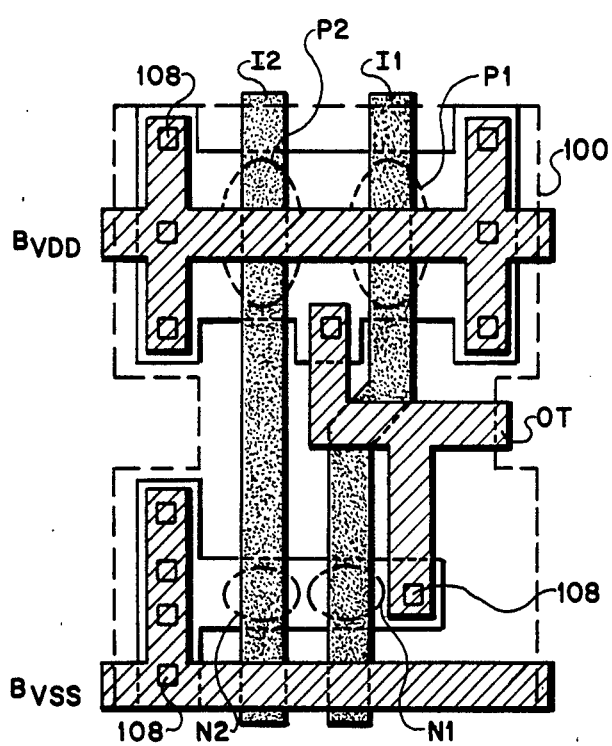
FIG. 2A is a plan view of an example of a pattern providing a 2-input CMOS NAND gate cell.
Figure 2B:
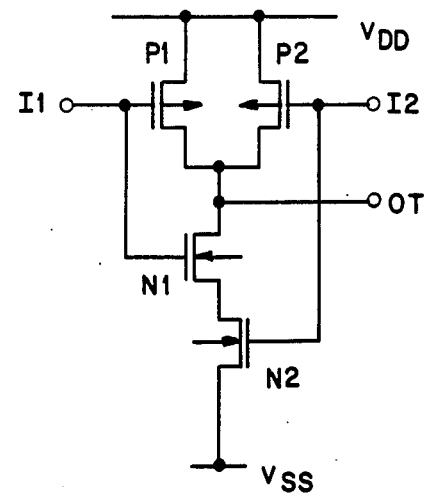
FIG. 2B is an equivalent circuit diagram of the 2-input NAND gate of FIG. 2A.
Figure 2C:
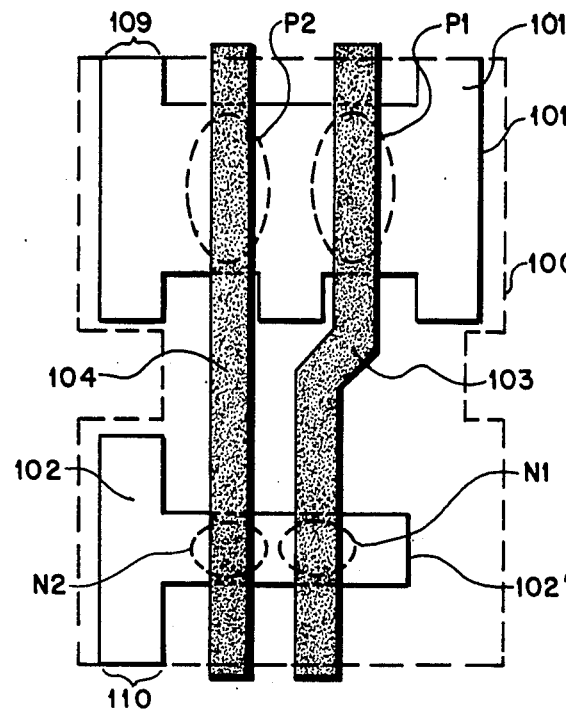
FIG. 2C is a plan view of the bulk pattern of MOS transistors constituting the 2-input NAND gate of FIG. 2A.
Figure 2D:
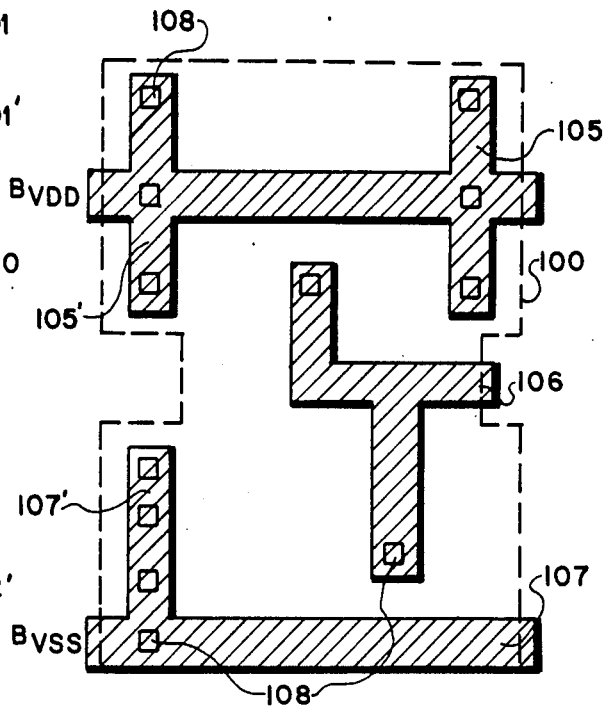
FIG. 2D is a plan view of the wiring pattern of inner wiring layers formed on the bulk pattern of FIG. 2C.
Figure 3B:
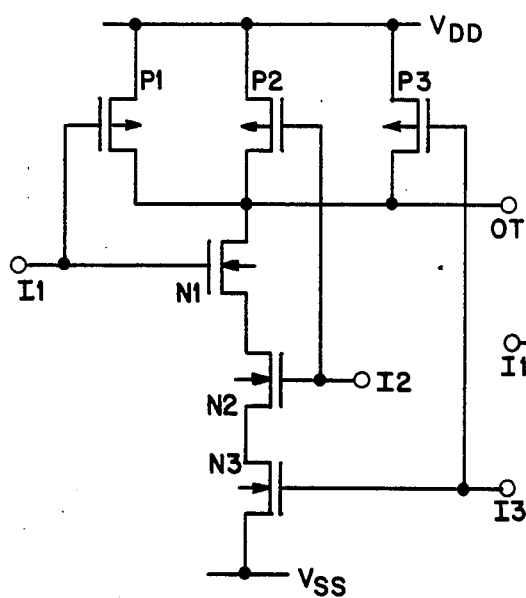
FIGS. 3B and 3C are the equivalent circuits of the 3-input NAND gate and 4-input NAND gate, respectively, of FIG. 3A.
Figure 3C:
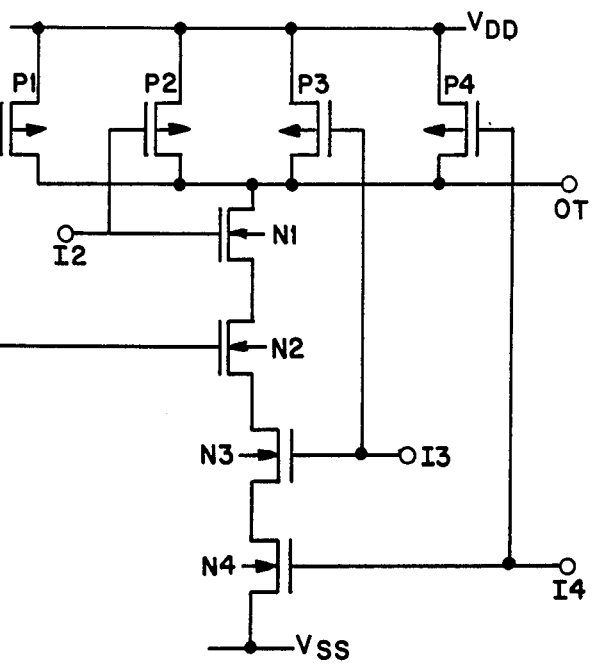
Figure 3A:
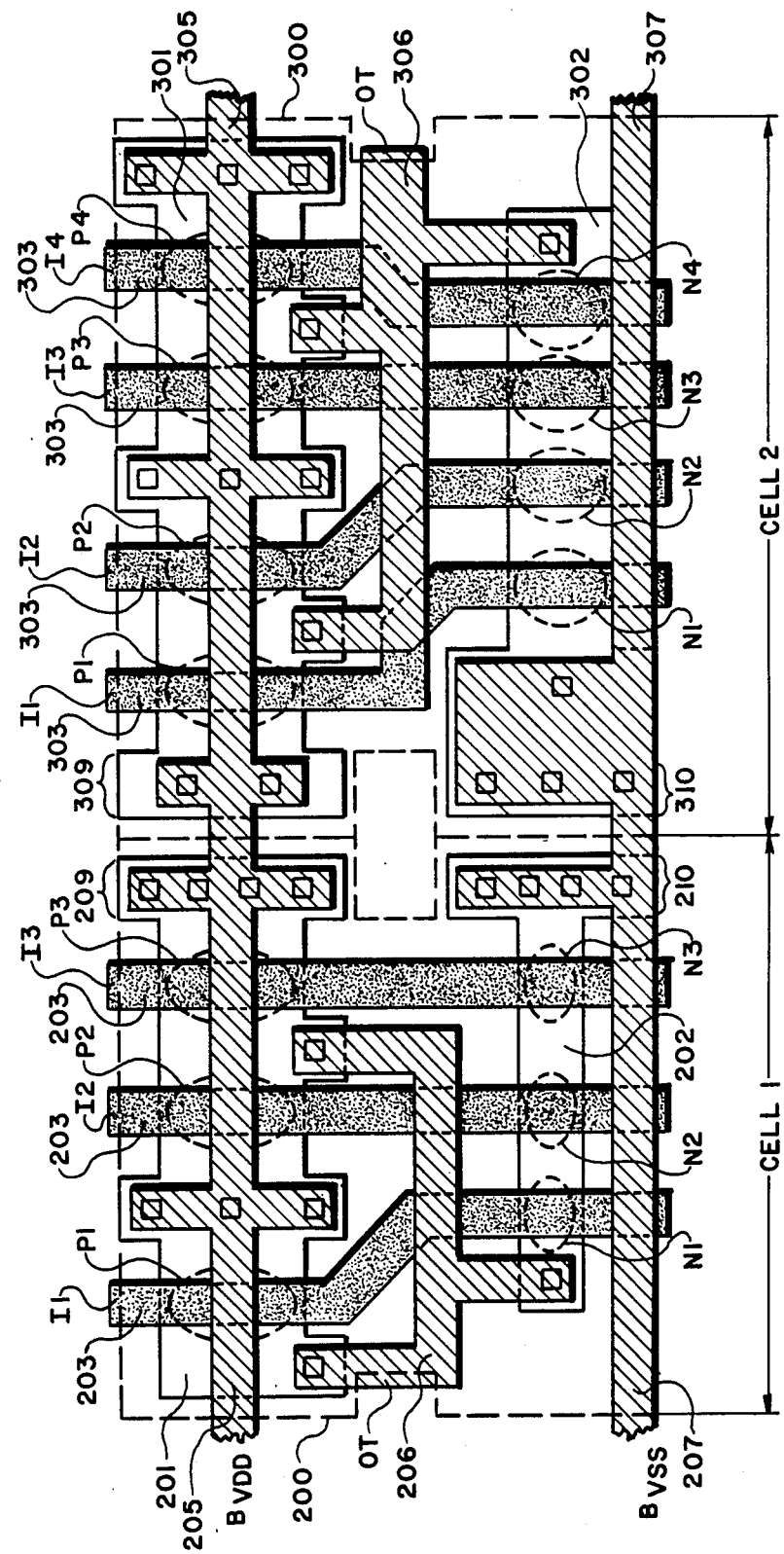
FIG. 3A is a plan view of a partial configuration of a CMOS-LSI comprising a 3-input NAND gate (Cell 1) and a 4-input NAND gate (Cell 2) positioned to abut each other according to conventional standard cell placement rules.

In the present invention, it is sufficient to cause such overlap between a pair of adjoining cells because the predefined pattern of each cell generally has a single pair of regions which can be standardized to be in common with another cell (as shown in FIGS. 2A or 3A). It is possible, of course, to design a cell to have two pairs of "common" regions to facilitate the overlapping of the cell with cells on one or both of its sides. However, in general, such a cell necessarily has a large lateral dimension, so that it is not desirable to include these additional "common" regions. Moreover, certain kinds of cells have no region which can be allotted for overlapping with other cells due to the nature of their patterns, and providing such a cell with an overlap region would result in the disadvantage of an increase in cell width. Therefore, for such cells, it is undesirable to add the auxiliary origin information mentioned with reference to FIG. 5B.

Figure 1:
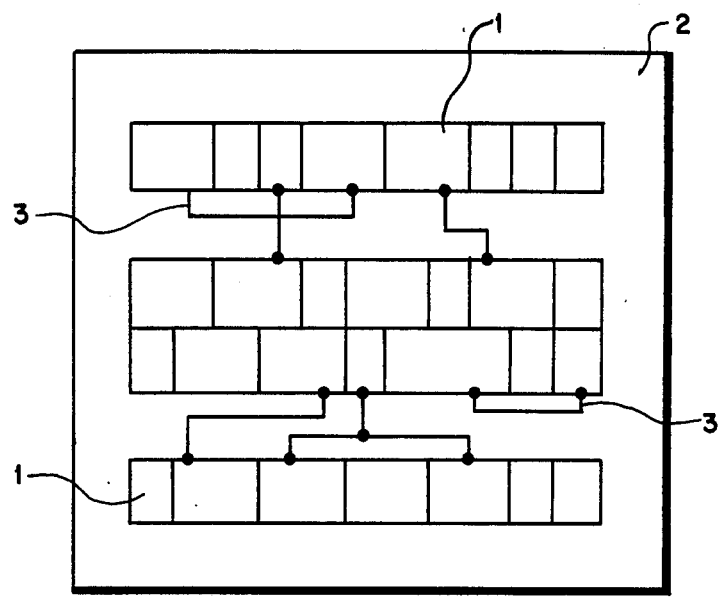
FIG. 1 is a schematic diagram of an example of cell placement and cell interconnection routing for an LSI.
Figure 6:
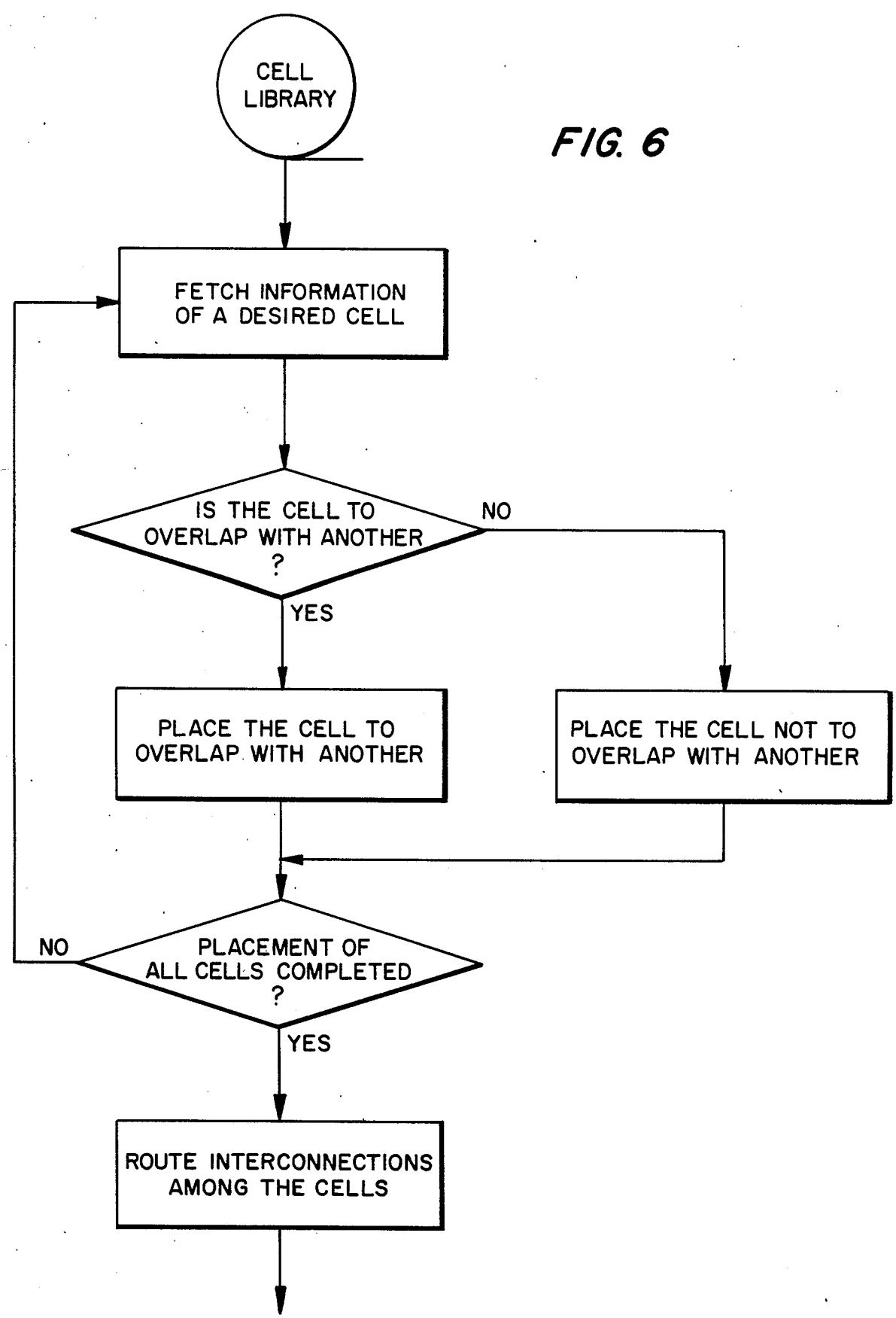
FIG. 6 is a flow chart for the process of cell placement according to the present invention.

FIG. 6 is a flow chart of the process for cell placement according to the present invention. When a cell is called by its name, the relevant cell information is fetched from a cell library and the frame of the cell is generated on a display screen. In the present invention, there is an extra step for deciding whether the cell is to be positioned overlapping another cell already on the display screen or not. If it is determined that the cell is not to be positioned overlapping another cell, the frame of the cell is positioned in the same manner as in the conventional standard cell methodology. If it is determined to make the cell overlap with another cell, the frames of these cells are positioned to have a common region as explained with reference to FIG. 5C. Thus, the cells are subjected to the decision step as they are called, and are positioned on the display screen one after another, until the positioning of all cells to be disposed on a chip is completed. After the completion of the cell positioning, the routing of interconnecting wirings among the cells (as illustrated in FIG. 1) is carried out.

Figure 7:
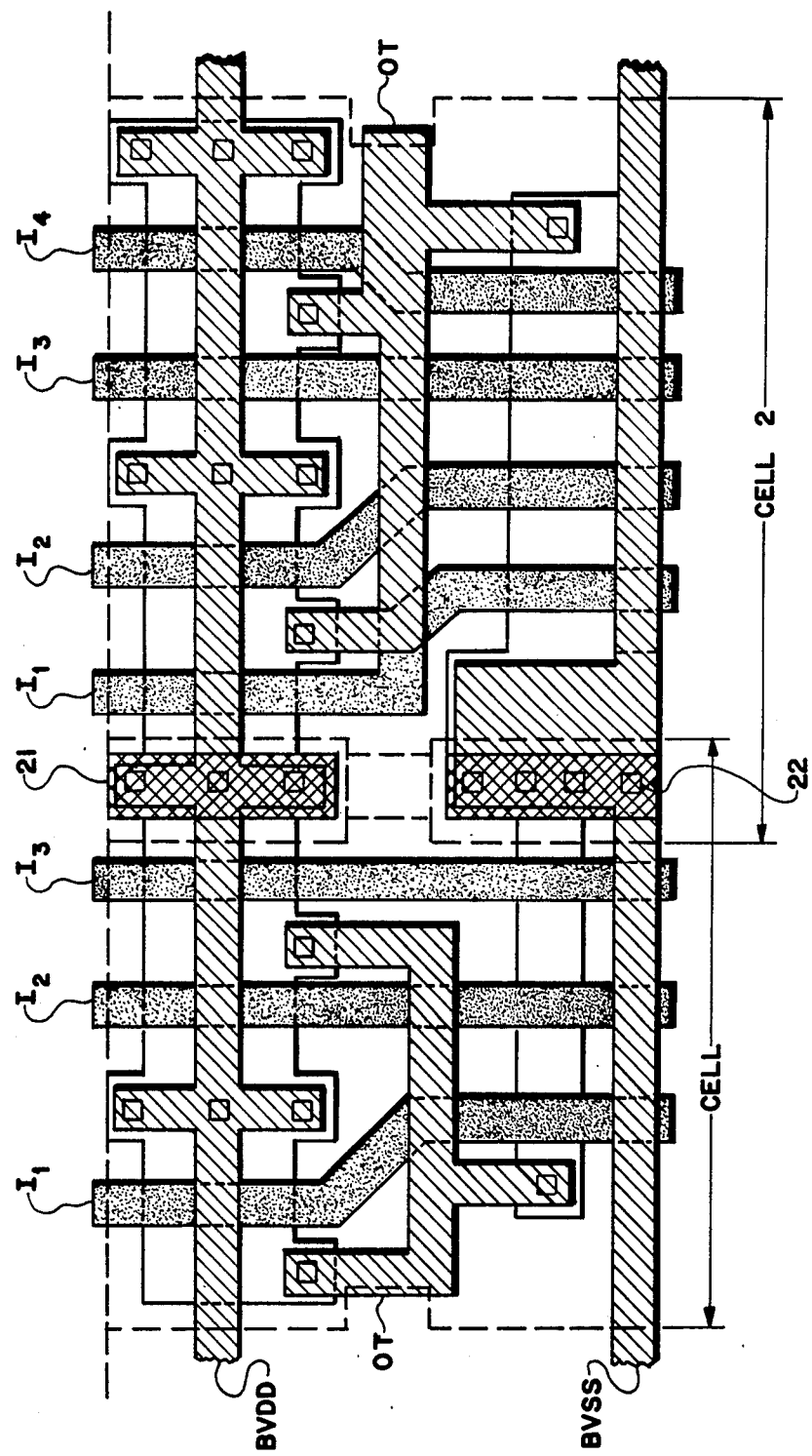
FIG. 7 is a plan view of a partial configuration of a CMOS-LSI comprising NAND gate cells positioned to overlap each other in accordance with the present invention.

FIG. 7 is a plan view of a partial configuration of a CMOS-LSI comprising a 3-input NAND gate (Cell 1) and a 4-input NAND gate (Cell 2) positioned to partially overlap each other in accordance with the present invention. The configurations of the NAND gate cells in FIG. 7 are almost the same as the NAND gate cells in FIG. 3A, and like references designate like or corresponding parts. Compared with FIG. 3A, the 3-input NAND gate (Cell 1) and 4-input NAND gate (Cell 2) in FIG. 7 have bus line contact regions 21 and 22 in common with each other (cross-hatched regions), and the reduction in the area required for the cells corresponds to the overlapping area.

As mentioned above, in the present invention, the pattern information of the 3-input NAND gate (Cell 1) and 4-input NAND gate (Cell 2) is modified in advance and registered to enable the overlapping of the bus line contact regions. That is, in contrast to the prior art of FIG. 3A, wherein corresponding bus line contact regions between cells 1 and 2 have individual patterns, the corresponding bus line contact regions in this embodiment are standardized to have a pattern in common with each other and are registered as part of the cell information in the cell library. Hence, with the present invention, positioning of cells can be carried out without regard to the pattern in each cell.

Figure 8A:
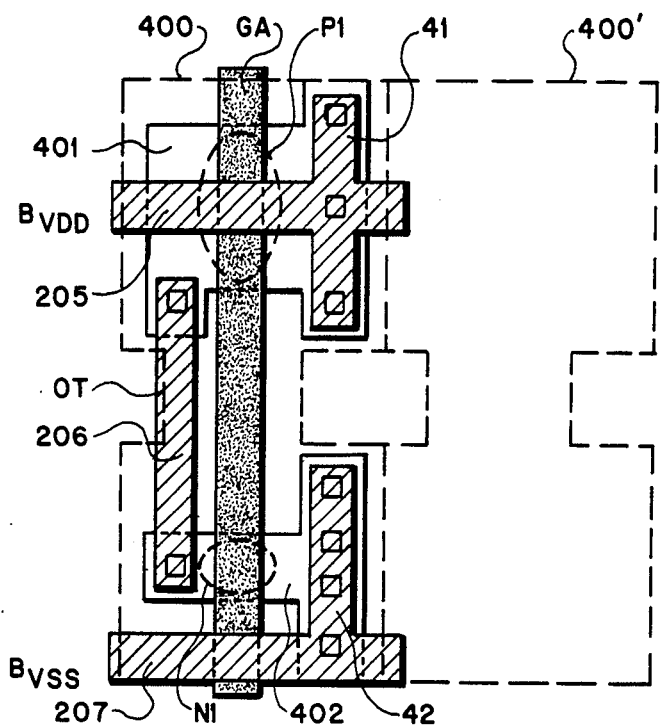
FIG. 8A is a plan view of an exemplary bulk pattern of a CMOS inverter cell.
Figure 8C:
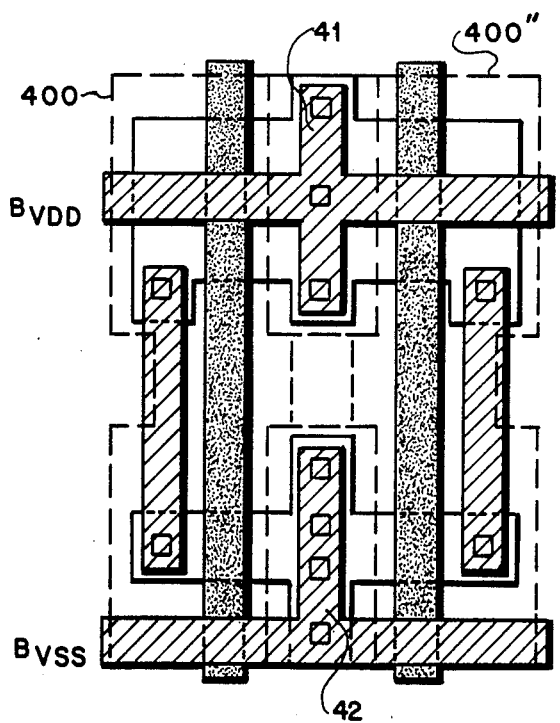
FIG. 8C is a plan view of a pair of inverter cells positioned to partially overlap each other in accordance with the present invention.
Figure 8B:
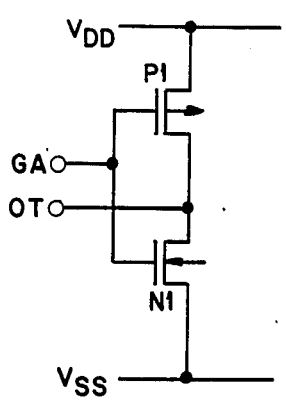
FIG. 8B is an equivalent circuit diagram corresponding to the bulk pattern of FIG. 8A.

FIG. 8A is a plan view of an embodiment of a bulk pattern of a CMOS inverter cell corresponding to the equivalent circuit shown in FIG. 8B. In a frame 400, the inverter cell comprises a p-type region 401 and an n-type region 402 in which a p-channel MOS transistor P1 and an n-channel MOS transistor N1, respectively, are formed. The transistors P1 and N1 have a common gate electrode GA (e.g., a layer of polysilicon) and are interconnected by wiring layers 205, 206 and 207 (e.g., aluminum). The wiring layers 205 and 207 respectively constitute the bus lines B$_{VDD}$ and B$_{VSS}$.

In prior art standard cell placement, the frames 400 and 400' of two inverter cells are placed to abut each other as shown in FIG. 8A, wherein the pattern in the frame 400' is identical to that in the frame 400. On the other hand, in the cell placement method according to the present invention, an inverted pattern of the inverter cell 400" is called and is positioned to partially overlap the frame 400, as shown in FIG. 8C. Thus, the inverter cells 400 and 400" have a pair of bus line contact regions 41 and 42 in common. Comparing FIG. 8C with FIG. 8A, it will be clear that a reduction in chip area is achieved by the overlapping area of the cells.

Figure 9B:
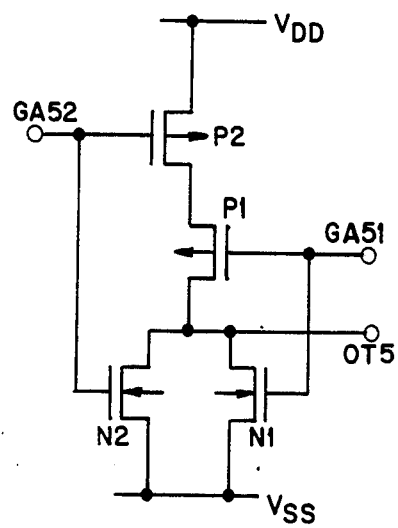
FIG. 9B is an equivalent circuit diagram of a 2-input NOR gate.
Figure 9A:
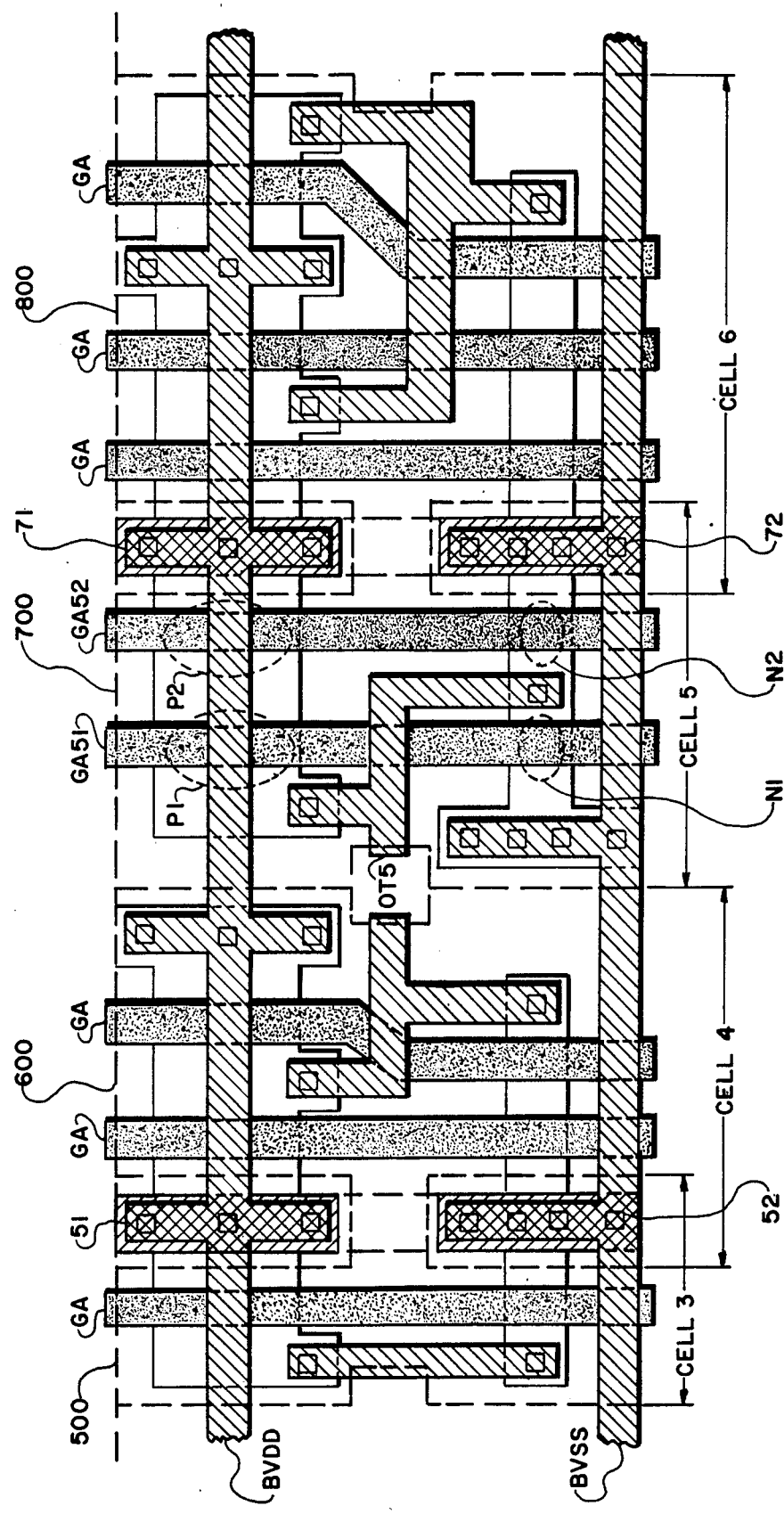
FIG. 9A is a plan view of a partial bulk pattern of a logic LSI comprising different kinds of CMOS gates consecutively disposed in a row.

FIG. 9A is a plan view of a partial bulk pattern of a logic LSI comprising CMOS gates including an inverter (Cell 3), a 2-input NAND gate (Cell 4), a 2-input NOR gate (Cell 5) and a 3-input NAND gate (Cell 6) consecutively disposed in a row, each having the corresponding equivalent circuit as disclosed in the above embodiments (except for the case of Cell 5 (2-input NOR gate )). The bulk patterns of the inverter (Cell 3) and 2-input NAND gate (Cell 4) are the same as those shown in FIGS. 8A and 2A, respectively, while the Cell 6 has the inverted bulk pattern of the 3-input NAND gate (Cell 1) in FIG. 3A. FIG. 9B is the equivalent circuit diagram of a 2-input NOR gate corresponding to the bulk pattern of Cell 5 in FIG. 9A. The construction of a 2-input NOR gate will be readily understood by those in the art and will not be discussed in detail.

As shown in FIG. 9A, Cells 3 and 4 are placed to have respective frames 500 and 600 partially overlapping each other, so that they have bus line contact regions 51 and 52 (both cross-hatched) in common. Similarly, Cells 5 and 6 are placed to have respective frames 700 and 800 partially overlapping each other, so that they have bus line contact regions 71 and 72 (both cross-hatched) in common. Between the cells 4 and 5 such overlapping cannot be provided, so that frames 600 and 700 abut each other as in conventional standard cell placement.

In summary, in the cell placement method according to the present invention, overlapping can be applied to two abutting cells even if the cells have different functions, and the inverted bulk pattern of a cell can be introduced to facilitate the overlapping when necessary.

It is convenient to assume in a practical chip design operation according to the present invention, that each cell and its inverted version are two different kinds of cells although they originate from the same pattern information registered in the cell library. The reson for this is that two abutting cells of the same kind cannot overlap each other, and one of them must be inverted for overlapping to occur, as mentioned above.

The above embodiments describe the placement of logic cells comprising CMOS transistors; however, the present invention can be applied to the design of an LSI comprising transistors other than CMOS type transistors, based on standard cell methodology, as long as the cells have similar bus line contact regions.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desirable to limit the invention to the exact construction and operation shown and described and, accordingly, all suitable modifications and equivalents may be resorted to, falling within the scope of the invention.

What is claimed is:

1. A semiconductor integrated circuit having a standard cell configuration, comprising at least two kinds of circuit cells disposed in a row, each of said at least two kinds of circuit cells having a bulk pattern including a predetermined set of circuit elements which are interconnected to form a circuit having a respective one of at least two kinds of logic functions, and wirings for supplying first and second power source voltages, said bulk pattern including a pair of regions on one side of said each circuit cell, said pair of regions being respectively connected to said wirings for suplying the first and second power source voltages, said pair of regions of said bulk pattern of one of said circuit cells of one kind overlapping said pair of regions of said bulk pattern of an adjoining one of said circuit cells of a different kind, said pair of regions of said bulk pattern of another one of said circuit cells being exclusively used by said another circuit cell without overlapping said pair of regions of said bulk pattern of any other of said circuit cells.

2. A semiconductor integrated circuit having a standard cell configuration, comprising:
. a substrate;
   a plurality of circuit cells formed in rows in said substrate, said circuit cells including:
   a first type of circuit cell, formed in said substrate, having a bulk pattern including a predetermined set of circuit elements interconnected to form a circuit having a first logic function, and having a first common region pattern on one side of said first type of circuit cell;

a second type of circuit cell, formed in said substrate, having a second bulk pattern including a predetermined set of circuit elements interconnected to form a circuit having a second logic function, and having a second common region pattern along one side of said second type of circuit cell, said first and second types of circuit cells being positioned in one of the rows on said substrate so that said first and second common region patterns are overlapping; and a common region formed in said substrate at the overlap of the first and second common region patterns, so that said common region forms a part of said first and second types of circuit cells.

3. A semiconductor integrated circuit as set forth in claim 2, wherein said common region comprises a common bus line contact region.

* * * * *

UNITED STATES PATENT AND TRADEMARK OFFICE
CERTIFICATE OF CORRECTION

PATENT NO. : 4,701,778
DATED : OCTOBER 20, 1987
INVENTOR(S) : NOBUHIKO ANEHA ET AL.

It is certified that error appears in the above-identified patent and that said Letters Patent is hereby corrected as shown below:

IN THE DRAWINGS:

In FIG. 7, at the bottom of the drawing, "CELL" should be --CELL 1--.

Col. 1, line 17, "user's" should be --users'--.

Signed and Sealed this

Tenth Day of May, 1988

*Attest:*

DONALD J. QUIGG

*Attesting Officer*        *Commissioner of Patents and Trademarks*